United States Patent
Mbouombouo et al.

(10) Patent No.: US 8,112,734 B2
(45) Date of Patent: Feb. 7, 2012

(54) OPTIMIZATION WITH ADAPTIVE BODY BIASING

(75) Inventors: Benjamin Mbouombouo, Saratoga, CA (US); Ramnath Venkatraman, San Jose, CA (US); Ruggero Castagnetti, Menlo Park, CA (US)

(73) Assignee: LSI Corporation, Milpitas, CA (US)

( * ) Notice: Subject to any disclaimer, the term of this patent is extended or adjusted under 35 U.S.C. 154(b) by 682 days.

(21) Appl. No.: 12/240,210

(22) Filed: Sep. 29, 2008

(65) Prior Publication Data
US 2010/0083193 A1 Apr. 1, 2010

(51) Int. Cl.
G06F 9/455 (2006.01)
G06F 17/50 (2006.01)

(52) U.S. Cl. .......... 716/132; 716/51; 716/108; 716/113; 716/118; 716/119; 716/126; 716/54

(58) Field of Classification Search .................... 716/51, 716/54, 132, 108, 113, 118, 119, 126
See application file for complete search history.

(56) References Cited

U.S. PATENT DOCUMENTS

| | | | |
|---|---|---|---|
| 7,332,807 B2 * | 2/2008 | Dani et al. | 257/706 |
| 2006/0202714 A1 * | 9/2006 | Hoang et al. | 326/38 |
| 2007/0152325 A1 * | 7/2007 | Dani et al. | 257/717 |
| 2007/0244676 A1 * | 10/2007 | Shang et al. | 703/2 |
| 2009/0119621 A1 * | 5/2009 | Cortadella et al. | 716/2 |

\* cited by examiner

*Primary Examiner* — Jack Chiang
*Assistant Examiner* — Brian Ngo
(74) *Attorney, Agent, or Firm* — Christopher P. Maiorana, PC

(57) ABSTRACT

A method incorporating adaptive body biasing into an integrated circuit design flow includes the steps of (A) adding adaptive body biasing input/outputs (I/Os) during a bonding layout stage of the integrated circuit design flow, (B) floorplanning the integrated circuit design, (C) generating an adaptive body biasing mesh and (D) generating a layout of the integrated circuit design based upon a plurality of adaptive body biasing corners.

20 Claims, 6 Drawing Sheets

OPTIMIZATION WITH ADAPTIVE BODY BIASING

FIELD OF THE INVENTION

The present invention relates to integrated circuit design flow generally and, more particularly, to a method and/or apparatus for implementing a design optimization with adaptive body biasing.

BACKGROUND OF THE INVENTION

Adaptive body biasing involves tuning a voltage threshold to either reduce leakage or gain to improve performance. Leakage reduction can be achieved by increasing the voltage threshold via a reverse body bias voltage while meeting chip level performance specifications. Performance improvement can be achieved by reducing the voltage threshold via a forward body bias voltage while meeting power (leakage) specifications. Both approaches can be merged in a single design. In conventional approaches, adaptive body biasing is applied as a post-processing and post-production step. The conventional methodology does not factor in the impact of adaptive body biasing at the design implementation level. Under the conventional methodology, designs are taped out at traditional corners, thereby giving away area, power and speed.

SUMMARY OF THE INVENTION

The present invention concerns a method incorporating adaptive body biasing into an integrated circuit design flow includes the steps of (A) adding adaptive body biasing input/outputs (I/Os) during a bonding layout stage of the integrated circuit design flow, (B) floorplanning the integrated circuit design, (C) generating an adaptive body biasing mesh and (D) generating a layout of the integrated circuit design based upon a plurality of adaptive body biasing corners.

The objects, features and advantages of the present invention include providing a method and/or apparatus for implementing a design optimization with adaptive body biasing that may (i) take advantage of voltage threshold variation (e.g., process corners and variation), VDD range and temperature variation for power reduction, area reduction, and performance boost during the design closure process, (ii) provide fast process and highest VDD at the best corner, (iii) provide automatic reverse body biasing for leakage power reduction, (iv) provide slow process and lowest VDD at the worst corner, (v) provide automatic forward biasing for improved performance, (vi) provide improved turnaround time for design closure, (vii) provide gate count reduction for leakage and dynamic power reduction, (viii) provide design corner detection mechanism, (ix) define optimization and sign off library corners, (x) handle voltage biasing voltage (Vbb) as a new static timing analysis (STA) parameter along with VDD, (xi) take body biasing into account during optimization by defining new design closure and sign off corners, (xii) provide area reduction for reduced cost and improved margin, (xiii) provide power reduction for competitiveness, cheaper packages, and less cooling, (xiv) provide performance improvement, (xv) provide ease of design closure and/or (xvi) provide faster turnaround time.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
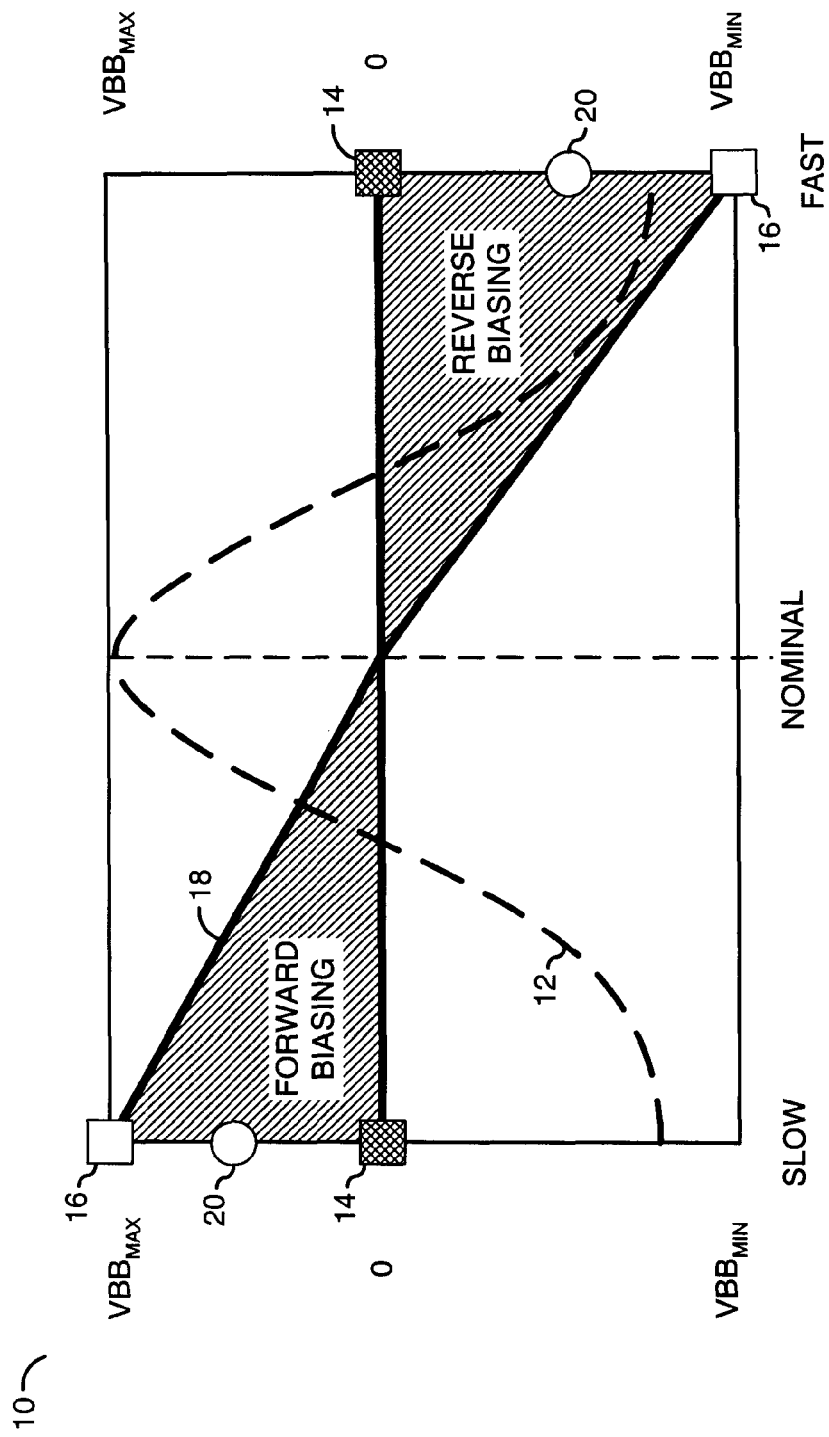
FIG. 1 is a diagram illustrating adaptive body biasing (ABB) design flow philosophy.

Referring to FIG. 1, a diagram is shown illustrating an adaptive body biasing (ABB) design flow philosophy 10 that may be used to understand embodiments of the present invention. In general, a process distribution curve 12 illustrates a performance range (e.g., from slow to fast) of integrated circuits that may be produced using a given integrated circuit design. During design closure, the performance range of the integrated circuits is generally set by defining signoff points 16. The design is generally optimized based a body biasing voltage (e.g., VBB) of zero (e.g., illustrated by a theoretical optimization and signoff line 18).

In an embodiment of the present invention, the performance of the actual integrated circuits may be adjusted during the design closure process by taking advantage of ABB during design optimization. A VBB other than zero (e.g., illustrated by design optimization points 20) may be defined based on the acceptable performance range. With the understanding that there will be slow parts, VBB may be adjusted to ease timing closure and reduce gate count. With the understanding that certain parts will be fast, VBB may be adjusted to reduce the total power. For example, an adaptive body-biasing optimization technique in accordance with an embodiment of the present invention may take advantage of a voltage threshold (e.g., Vth) variation (e.g., process corners and variation), supply voltage (e.g., VDD) range and temperature variation to obtain power reduction, area reduction and performance boost during design closure.

In one example, automatic reverse body biasing may be applied at the best case corner (e.g. fast process, highest VDD) to reduce power consumption (e.g., leakage). In another example, automatic forward body biasing may be applied at the worst corner (e.g., slow process, lowest VDD) to improve performance, improve turnaround time for design closure and reduce gate count (or area). The reduction in gate count and/or area may result in reduced leakage and dynamic power. In general, embodiments of the present invention may include a design corner detection mechanism, a definition of optimization and signoff library corners, methods of generating and regulating the body biasing voltage, and a process for handling the body biasing voltage VBB as a new static timing analysis (STA) parameter along with supply voltage VDD. Just as a design closure and/or sign off corner specifies a supply voltage (e.g., VDD-10%), a design closure and/or sign off corner in accordance with embodiments of the present invention may also specify a particular VBB as another parameter. For example, a corner may be defined PVTVBB: Process, Voltage, Temperature Biasing voltage. In one embodiment, a user will not need to adjust VBB. Rather, every PVT may have a predefined VBB.

Figure 2:
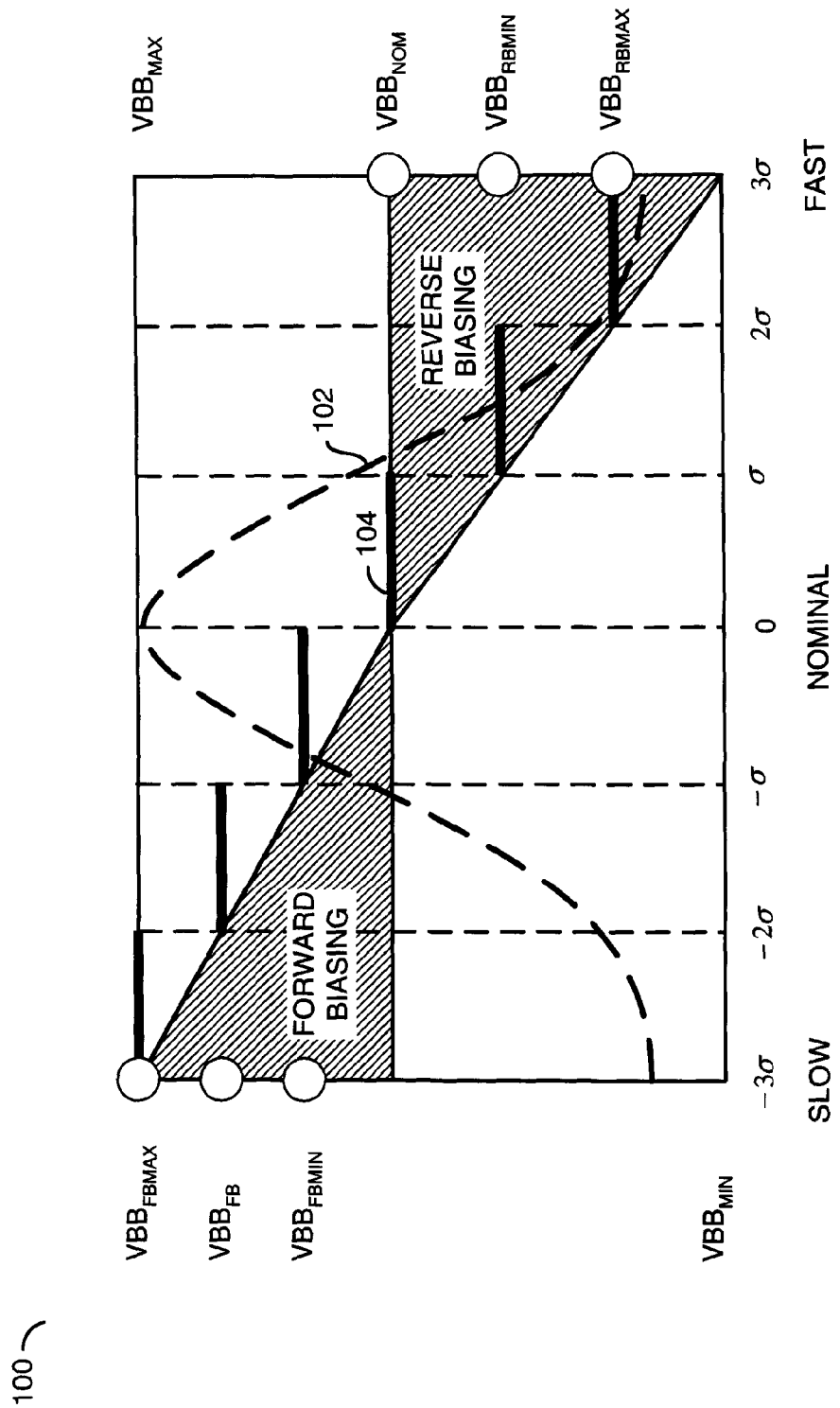
FIG. 2 is a diagram illustrating an example of adaptive body biasing.

Referring to FIG. 2, a diagram 100 is shown illustrating an example of adaptive body biasing optimization in accordance with preferred embodiments of the present invention. A process distribution is illustrated by curve 102. In one example, the optimization and signoff line may be implemented as a step function 104. A designer may select one of a number of performance regions for a design and an appropriate operating body biasing voltage VBB may be automatically set based upon predefined library corners. A design tool may be configured to take into account the operating body biasing voltage VBB during layout (e.g., place and route operations) and static timing analysis to reduce leakage power, reduce area and/or increase performance during the design closure process.

The granularity of the body biasing voltage VBB may be varied. In one example, a VBB look-up table may be implemented as part of the design library. For example, a look-up table associating a number of process ranges to a corresponding VBB may be implemented as illustrated in the following TABLE 1:

TABLE 1

VBB Look-up Table

| Process Range | VBB | Polarity of VBB |
|---|---|---|
| $-3\sigma$ to $-2\sigma$ | Vfbmax | + |
| $-2\sigma$ to $-1\sigma$ | Vfb | + |
| $-1\sigma$ to 0 | Vfbmin | + |
| 0 to $1\sigma$ | 0 | |
| $1\sigma$ to $2\sigma$ | Vrbmin | − |
| $2\sigma$ to $3\sigma$ | Vrbmax | − | where $\sigma$ represents a standard deviation of the process distribution 102, Vfb represents a forward biasing voltage and Vrb represents a reverse biasing voltage. The number and/or size of the process ranges may be varied to meet the design criteria of a particular implementation. In an alternative example, a closed-loop ABBO solution may be implemented. For example, an internal (e.g., on-chip) automatic bias voltage generation/regulation module may be incorporated into the design. In one example, the body biasing voltage may be automatically adjusted by the on-chip voltage generation/regulation module as a continuous function of an operating condition of the chip.

Figure 3:
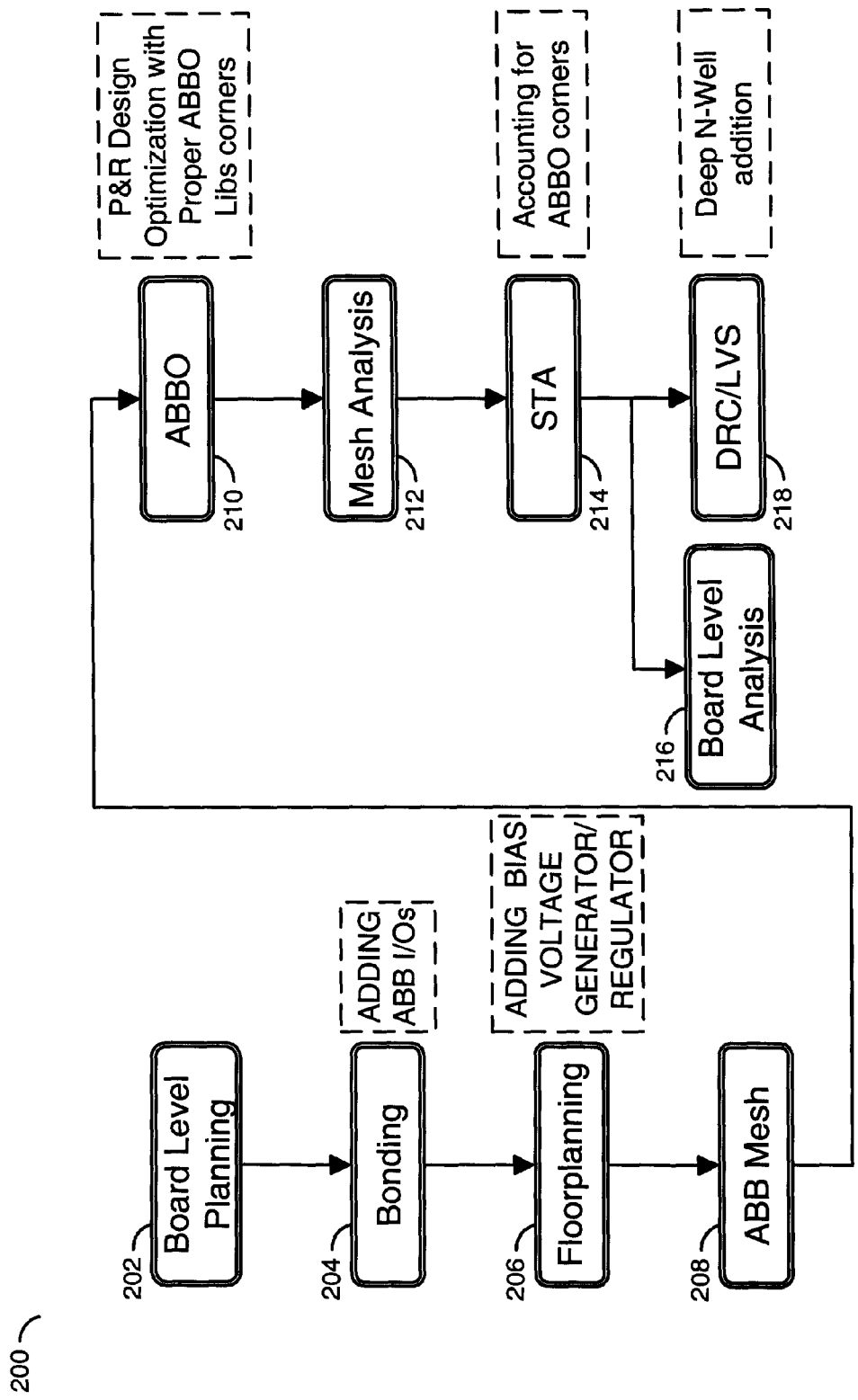
FIG. 3 is a diagram illustrating an adaptive body biasing design flow in accordance with an embodiment of the present invention.

Referring to FIG. 3, a flow diagram of a process 200 is shown illustrating a design flow implementing design optimization with adaptive body biasing in accordance with an embodiment of the present invention. In one example, the process 200 may be implemented in software and/or hardware. For example, the process 200 may be implemented as one or more modules (or routines) in an electronic design automation (EDA) tool or tool suite.

In one example, the process 200 may comprise a step (or stage) 202, a step (or stage) 204, a step (or stage) 206, a step (or stage) 208, a step (or stage) 210, a step (or stage) 212, a step (or stage) 214, a step (or stage) 216 and a step (or stage) 218. The step 202 comprise one or more board level planning operations. The step 204 may comprise a bonding operation. In one example, the bonding operation may include adding I/Os for implementing adaptive body biasing. The step 206 may comprise a floorplanning operation. The floorplanning operation may include adding one or more bias voltage generator/regulators. The step 208 may comprise an adaptive body biasing mesh layout operation. The steps 202 through 208 may be implemented using conventional techniques.

The step 210 may comprise an adaptive body biasing optimization process in accordance with an embodiment of the present invention. For example, a place and route design optimization operation may be performed that utilizes appropriate adaptive body biasing optimization (ABBO) corners from a cell library. For example, a place and route tool may be configured to retrieve the ABBO corners from a library stored on a computer readable storage medium. The step 212 may comprise a mesh analysis operation. The mesh analysis operation may be implemented using conventional techniques.

The step 214 may comprise a static timing analysis (STA) operation in accordance with the teachings of the present disclosure. The static timing analysis in accordance with embodiments of the present invention generally differs from conventional methods by taking into account adaptive body biasing optimization corners. In one example, a static timing analysis tool may be configured to retrieve library ABBO corners and/or STA scripts configured to take into account the library ABBO corners. In one example, the STA scripts may be stored on the same computer readable storage medium as the cell library. The step 216 may comprise a board level analysis stage. The step 218 may comprise design rule checking (DRC) and layout-versus-schematic (LVS) checking operations. In one example, step 218 may includes checks for deep n-well additions.

The library characterizations for adaptive body biasing optimization in accordance with embodiments of the present invention may include information concerning delay and power as functions of process, voltage, temperature and bias voltage. In general, adaptive body biasing corners may be defined and added to the library for use with design tools implemented in accordance with embodiments of the present invention. In one example, using the process (or Kp) based adaptive body biasing, the selected-Kp generally drives the number of extra library corners. The added design closure and/or sign off corners may specify a particular VBB as another parameter. For example, a corner may be defined as PVTVBB: Process, Voltage, Temperature and Biasing voltage. In one embodiment, every PVT may have a predefined VBB. The bias voltage automatically selects the proper ABB corner.

Figure 4B:
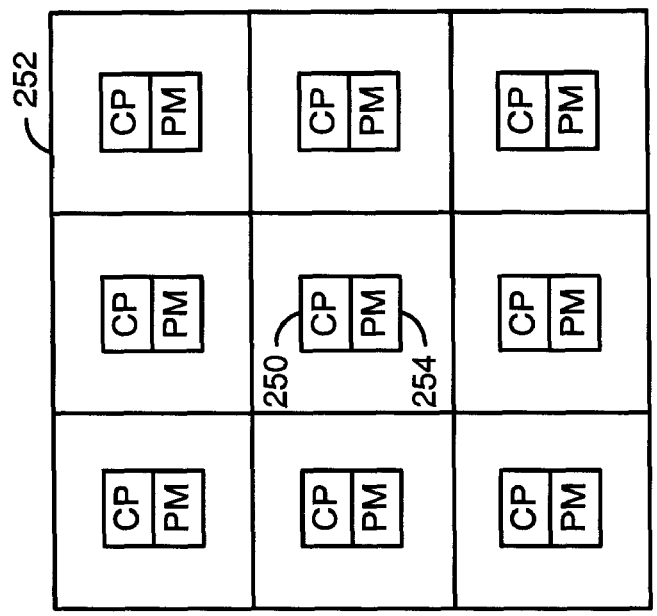
FIGS. 4A and 4B are diagrams illustrating example methods to provide body biasing voltages.
Figure 4A:
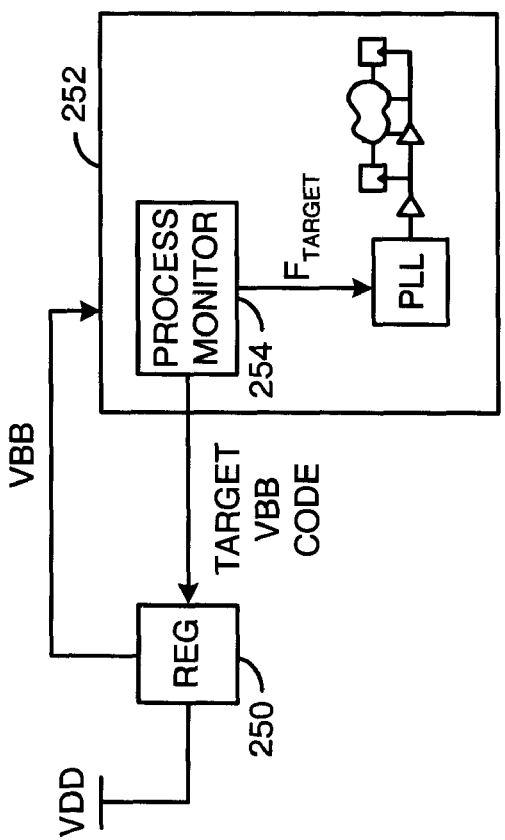

Referring to FIGS. 4A and 4B, diagrams are shown illustrating example methods to provide the body biasing voltage. In one example (FIG. 4A), a voltage source and regulation block 250 may be implemented external to a die 252. In one example, the body biasing voltage VBB may be locked to a fixed value once the process has been identified (e.g., an open-loop scenario). For example, a fuse may be blown. In another example, the body biasing voltage VBB may be variable. For example, the body biasing voltage may be automatically adjusted as a function of a condition on the die 252 (e.g., a closed-loop scenario). In one example, a process (or critical path) monitor 254 may be used to identify the process corner of the die.

In another example (FIG. 4B), internal bias voltage generation and regulation may be implemented. For example, multiple voltage sources 260 (e.g., charge pumps, etc.) may be placed inside the die 262. The voltage supplied by the voltage sources 260 may be generated and regulated as a function of one or more conditions on the die (e.g., closed-loop operation). In one example, a respective process (or critical path) monitor 264 may be implemented with each voltage source 260 to identify the process corner of the die.

Figure 5:
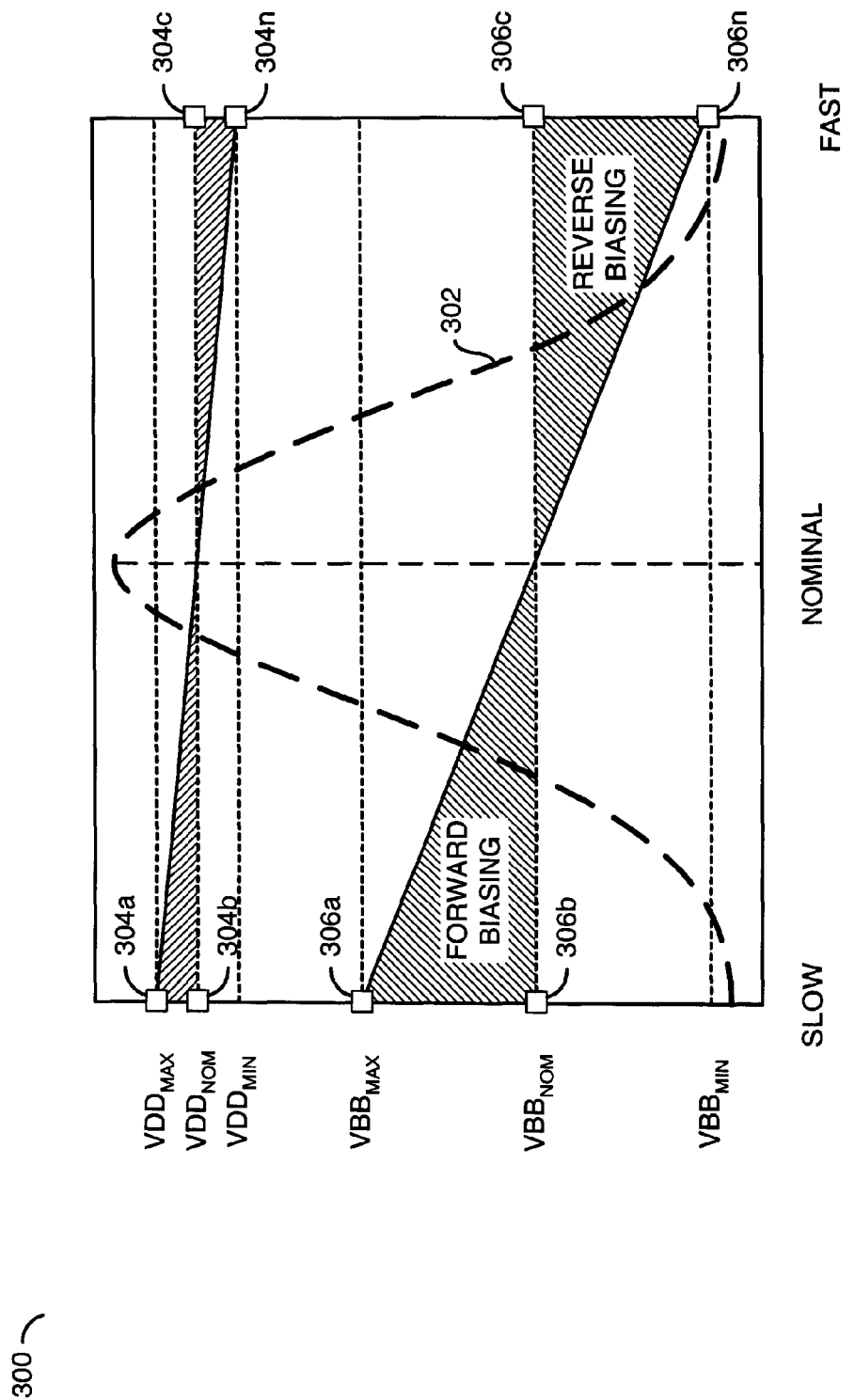
FIG. 5 is a diagram illustrating a pictorial overlapping of ABB optimization and adaptive voltage scaling (AVS) optimization.

Referring to FIG. 5, a diagram 300 is shown illustrating a pictorial overlapping of AVS optimization with ABB optimization in accordance with an embodiment of the present invention. In one example, adaptive voltage scaling optimization (AVSO) may be implemented in addition to adaptive body biasing optimization (ABBO) to reduce power consumption. In one example, power reduction contributions attributable to AVSO and ABBO may be represented by the equations in the following TABLE 2:

TABLE 2

| AVSO | ABBO |
|---|---|
| $C_{eff} * V_{dd}^2 * f$ | $K_1 * V_{dd} * e^{(K_2 * V_{dd} + K_3 * V_{bs})}$ |
| $K_1 * V_{dd} * e^{(K_2 * V_{dd})}$ | $|V_{bs}| * I_j$ |

In the TABLE 2 above: $C_{eff}$ represents the effective switched capacitance per cycle (e.g., wire loading and cell input capacitance at chip level); $V_{dd}$ represents the chip level supply voltage; f represents the chip level clock frequency; $K_1$, $K_2$, $K_3$ represent constants; $V_{bs}$ represents the biasing voltage (e.g., applied between the body and the source of a transistor); $I_j$ represents the junction current.

The terms in the column labeled AVSO generally capture the power that may be impacted by AVSO. For example, the first term, in the upper row, generally represents the dynamic power as a function of $V_{dd}^2$. The second term, in the lower row, generally represents a subthreshold leakage power as a function of $V_{dd}$. The terms in the ABBO column generally represent power that may be impacted by ABBO. For example, the first term, in the upper row, generally represents power consumption due to the subthreshold leakage power. The second term, in the lower row, generally represents the power consumption due to the junction leakage power. The equations in TABLE 2 may be used to quantify the power reduction provided by each of the power reduction techniques (AVSO, ABBO).

A process distribution 302 generally characterizes a performance range that may be expected during production of a given integrated circuit design. The squares 304a-304n generally represent example AVSO library corners. The squares 306a-306n generally represent example ABBO library corners. The number of library corners may be varied according to the design criteria of the particular implementation. A diagram similar to diagram 300 in FIG. 4 may be utilized to generate appropriate library corners. In one example, the combined AVSO and ABBO corners analyzed during a design closure process may include, but are not limited to, setup, hold and power corners, examples of which are illustrated in the following TABLE 3:

TABLE 3

| | Setup 1 | | Setup 2 | | Hold 1 | | Hold 2 | | Worst Case Power |
|---|---|---|---|---|---|---|---|---|---|
| VDD | NOM | NOM | $VDD_{MIN}$ | $VDD_{MIN}$ | NOM | NOM | $VDD_{MAX}$ | $VDD_{MAX}$ | NOM |
| VBB | 0 | 0 | $VBB_{MIN}$ | $VBB_{MIN}$ | 0 | 0 | $VBB_{MAX}$ | $VBB_{MAX}$ | 0 |
| Temp. | 125° C. | -40° C. | 125° C. | -40° C. | 125° C. | -40° C. | 125° C. | -40° C. | 125° C. |
| Process Corner | SS | SS | FF | FF | FF | FF | SS | SS | FAST |

Optimization at the ABBO and/or AVSO corners (e.g., listed in TABLE 3) generally provides a significant area reduction for standard cells, ease of design closure and power reduction (e.g., static and dynamic). In general, the individual impacts of AVSO and ABBO may be taken into account when selecting the corners for both AVSO and ABBO.

Figure 6:
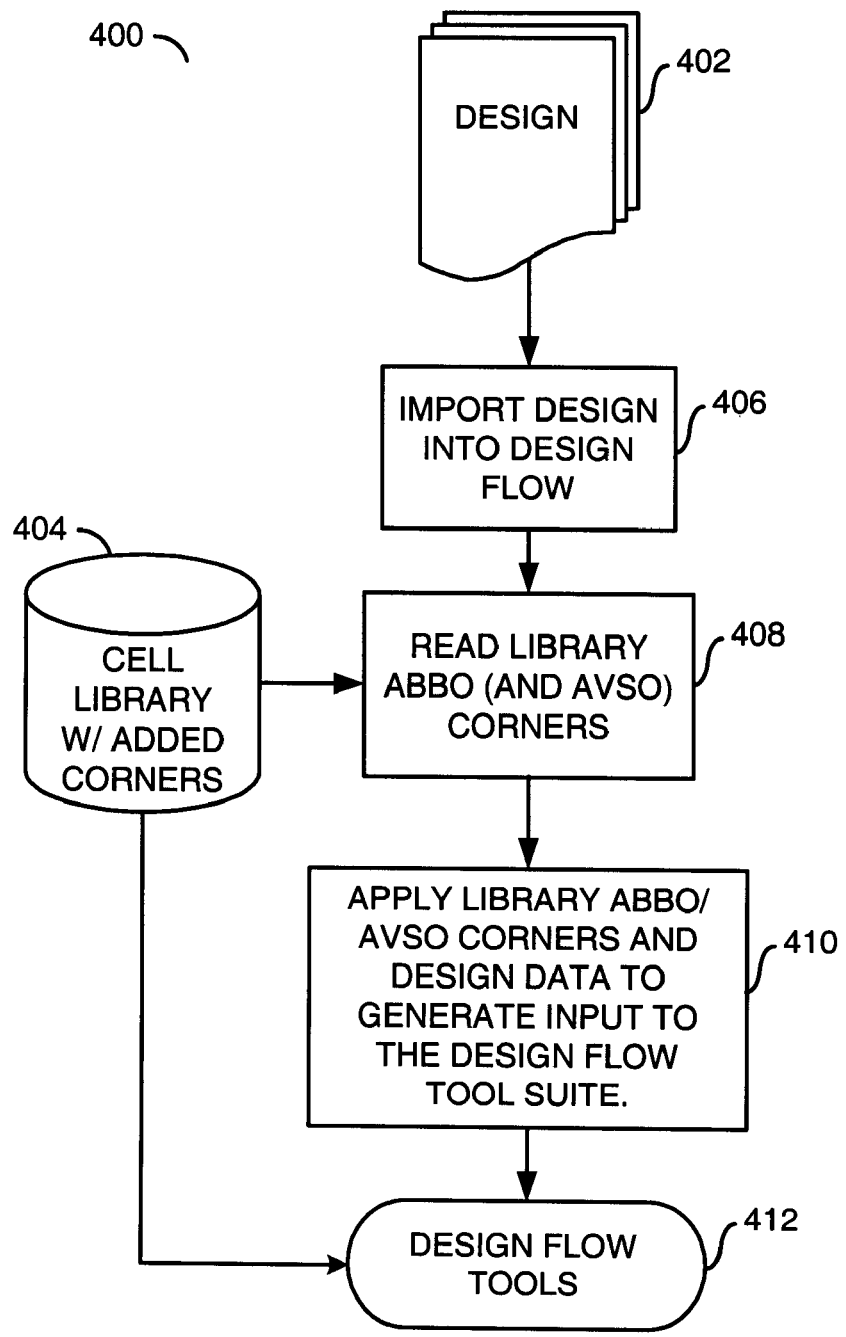
FIG. 6 is a diagram illustrating operation of a design tool in accordance with an embodiment of the present invention.

Referring to FIG. 6, a flow diagram 400 is shown illustrating operation of a design tool in accordance with an embodiment of the present invention. In one example, an integrated circuit design 402 may be optimized based on ABBO and/or AVSO corners added to a library 404. The library 404 may be stored on a computer readable storage medium. In one example, a process 406 may be configured to import the design into a design flow. A process 408 may be configured to retrieve the added ABBO and/or AVSO corners from the library 404. A process 410 may be configured to generate input to a design tool or tool suite 412 based upon the design 402 and the library corners. The design tool or tool suite 412 may be configured to perform operation like the ones described above in connection with FIG. 3 based on the input received from the process 410 and/or information in the library 404.

The functions represented by the flow diagram of FIG. 3 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, magneto-optical disks, ROMS, RAMS, EPROMs, EEPROMs, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the scope of the invention.

The invention claimed is:

1. A method incorporating adaptive body biasing into an integrated circuit design flow comprising the steps of:
   providing a cell library for said integrated circuit design flow, wherein said cell library is stored in a non-transitory computer readable medium and specifies a plurality of adaptive body biasing corners, each adaptive body biasing corner defining respective process, voltage, temperature, and body biasing voltage parameters;
   adding adaptive body biasing input/outputs (I/Os) to a layout of an integrated circuit design to implement said adaptive body biasing, wherein said adaptive body biasing I/Os are added during a bonding layout stage of said integrated circuit design flow;

performing a floorplanning operation that includes adding at least one bias voltage source to the integrated circuit design layout by using a computer;
performing an adaptive body biasing mesh layout operation; and
performing a place and route operation configured to retrieve and utilize at least one of said plurality of adaptive body biasing corners from said cell library.

2. The method according to claim 1, further comprising the step of:
performing mesh analysis on the integrated circuit design layout.

3. The method according to claim 2, further comprising the step of:
performing a static timing analysis on the integrated circuit design layout, wherein said static timing analysis is configured to retrieve at least one of (i) adaptive body biasing optimization corners from said cell library and (ii) static timing analysis scripts configured to take into account the adaptive body biasing optimization corners from said cell library.

4. The method according to claim 3, further comprising the step of:
performing board level analysis of said layout of said integrated circuit design.

5. The method according to claim 3, further comprising the step of:
performing a design rule check (DRC) and layout versus schematic (LVS) analysis that includes checking for a deep N-well addition in the integrated circuit design layout.

6. The method according to claim 1, further comprising the step of performing board level planning prior to said bonding layout stage.

7. The method according to claim 1, wherein the step of generating said layout of said integrated circuit design is further based upon adaptive voltage scaling (AVS) corners.

8. The method according to claim 1, wherein the plurality of adaptive body biasing corners comprise maximum, nominal and minimum values for a body biasing voltage.

9. The method according to claim 1, wherein the plurality of adaptive body biasing corners comprise at least two values in addition to maximum, nominal and minimum values for a body biasing voltage.

10. A computer system incorporating adaptive body biasing optimization during design closure of an integrated circuit design, said computer system configured to:
add adaptive body biasing input/outputs (I/Os) to a layout of an integrated circuit design to implement said adaptive body biasing, wherein said adaptive body biasing I/Os are added during a bonding layout stage of an integrated circuit design flow;
perform a floorplanning operation that includes adding at least one bias voltage source to the layout for said integrated circuit design by using a computer;
perform an adaptive body biasing mesh layout operation for said integrated circuit design; and
perform a place and route operation configured to retrieve and utilize at least one of a plurality of adaptive body biasing optimization corners, wherein said plurality of adaptive body biasing optimization corners are retrieved from a cell library and define process, voltage, temperature, and body biasing voltage parameters for respective cells of said cell library.

11. The computer system according to claim 10, further comprising a routine configured to:
perform mesh analysis on the layout of said integrated circuit design.

12. The computer system according to claim 11, further comprising a routine configured to:
perform a static timing analysis on the integrated circuit design layout, wherein said static timing analysis is configured to retrieve at least one of (i) adaptive body biasing optimization corners from said cell library and (ii) static timing analysis scripts configured to take into account the adaptive body biasing optimization corners from said cell library.

13. The computer system according to claim 12, further comprising a routine configured to
perform board level analysis of said layout of said integrated circuit design.

14. The computer system according to claim 12, further comprising a routine configured to:
perform a design rule check (DRC) and layout versus schematic (LVS) analysis that includes checking for a deep N-well addition to the integrated circuit design layout.

15. The computer system according to claim 10, further comprising a routine configured to perform board level planning prior to said bonding layout stage.

16. The computer system according to claim 10, wherein the generation of said layout of said integrated circuit design is further based upon adaptive voltage scaling (AVS) corners.

17. The computer system according to claim 10, wherein the plurality of adaptive body biasing corners comprise maximum, nominal and minimum values for a body biasing voltage.

18. The computer system according to claim 10, wherein the plurality of adaptive body biasing corners comprise at least two values in addition to maximum, nominal and minimum values for a body biasing voltage.

19. A non-transitory computer readable medium, which when executed by a computer incorporates adaptive body biasing into an integrated circuit design flow, comprising the steps of:
adding adaptive body biasing input/outputs (I/Os) to a layout of an integrated circuit design to implement said adaptive body biasing, wherein said adaptive body biasing I/Os are added during a bonding layout stage of said integrated circuit design flow;
performing a floorplanning operation that includes adding at least one bias voltage source to the integrated circuit design layout by using a computer;
performing an adaptive body biasing mesh layout operation; and
performing a place and route operation configured to retrieve and utilize at least one of a plurality of adaptive body biasing corners from a cell library, wherein said cell library is stored in said non-transitory computer readable medium and specifies a plurality of adaptive body biasing corners, each adaptive body biasing corner defining respective process, voltage, temperature, and body biasing voltage parameters.

20. The non-transitory computer readable medium according to claim 19, wherein said cell library further comprises:
information characterizing a plurality of adaptive voltage scaling corners for said plurality of cells.

* * * * *